(12) United States Patent
Ritter et al.

(10) Patent No.: US 7,528,459 B2
(45) Date of Patent: May 5, 2009

(54) PUNCH-THROUGH DIODE AND METHOD OF PROCESSING THE SAME

(75) Inventors: Hans-Martin Ritter, Nahe (DE); Martin Lübbe, Hamburg (DE); Jochen Wynants, Schenefeld (DE)

(73) Assignee: NXP B.V., Eindhoven (NL)

( * ) Notice: Subject to any disclaimer, the term of this patent is extended or adjusted under 35 U.S.C. 154(b) by 603 days.

(21) Appl. No.: 10/561,895

(22) PCT Filed: May 24, 2004

(86) PCT No.: PCT/IB2004/050765

§ 371 (c)(1),
(2), (4) Date: Dec. 21, 2005

(87) PCT Pub. No.: WO2004/107454

PCT Pub. Date: Dec. 9, 2004

(65) Prior Publication Data

US 2006/0158801 A1      Jul. 20, 2006

(30) Foreign Application Priority Data

May 27, 2003   (EP)   ................... 03101538

(51) Int. Cl.
*H01L 27/095* (2006.01)
(52) U.S. Cl. .............. 257/471; 257/474; 257/476; 257/478; 257/479; 257/E29.338
(58) Field of Classification Search ........... 257/109, 257/110, 155, 267, 280, 453, 457, 471, 474, 257/476, 478, 479, 497, 548, 556, E29.338
See application file for complete search history.

(56) References Cited

U.S. PATENT DOCUMENTS

| | | | | | |
|---|---|---|---|---|---|
| 3,614,560 | A | * | 10/1971 | Anantha | 257/474 |
| 3,846,192 | A | * | 11/1974 | Murrmann | 438/328 |
| 3,909,837 | A | * | 9/1975 | Kronlage | 257/479 |
| 4,062,033 | A | * | 12/1977 | Suzuki | 257/474 |
| 4,089,020 | A | * | 5/1978 | Ikeda et al. | 257/475 |
| 4,104,732 | A | * | 8/1978 | Hewlett, Jr. | 365/179 |
| 4,107,719 | A | * | 8/1978 | Graul et al. | 257/474 |
| 4,156,246 | A | * | 5/1979 | Pedersen | 257/474 |
| 4,228,448 | A | * | 10/1980 | Lalumia et al. | 257/474 |
| 4,454,523 | A | * | 6/1984 | Hill | 257/264 |
| 4,965,643 | A | * | 10/1990 | Freeman | 257/73 |
| 5,416,354 | A | * | 5/1995 | Blackstone | 257/499 |
| 6,633,071 | B1 | * | 10/2003 | Furio | 257/383 |
| 7,112,865 | B2 | * | 9/2006 | Fujihira et al. | 257/484 |
| 2003/0030120 | A1 | * | 2/2003 | Fujihira et al. | 257/471 |
| 2004/0075135 | A1 | * | 4/2004 | Plikat | 257/327 |

FOREIGN PATENT DOCUMENTS

| | | | | |
|---|---|---|---|---|
| GB | 2184599 | A | * | 6/1987 |
| JP | 56090565 | A | * | 7/1981 |
| JP | 58 161378 | | | 9/1983 |
| JP | 61048970 | A | * | 3/1986 |

* cited by examiner

*Primary Examiner*—Jerome Jackson, Jr.
*Assistant Examiner*—Jose R Diaz

(57) ABSTRACT

A monolithically integrated punch-through diode with a Schottky-like behavior. This is achieved as a Schottky-metal area (16) is deposited onto at least part of the first p-doped well's (9) surface. The Schottky-metal area (16) and the p-doped well (9) form the metal-semiconductor-transition of a Schottky-diode. The overvoltage protection of the inventive PT-diode is improved as the forward characteristic has a voltage drop that is less than 0.5V.

10 Claims, 4 Drawing Sheets

Figure 3A:
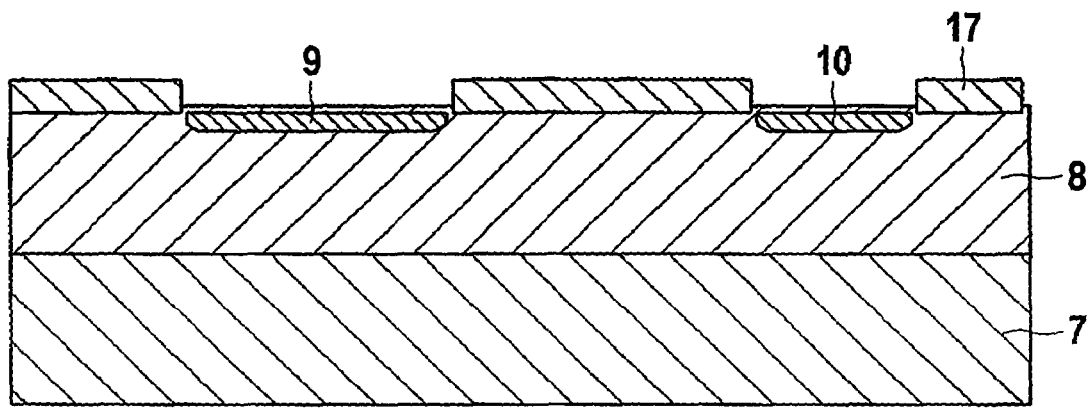

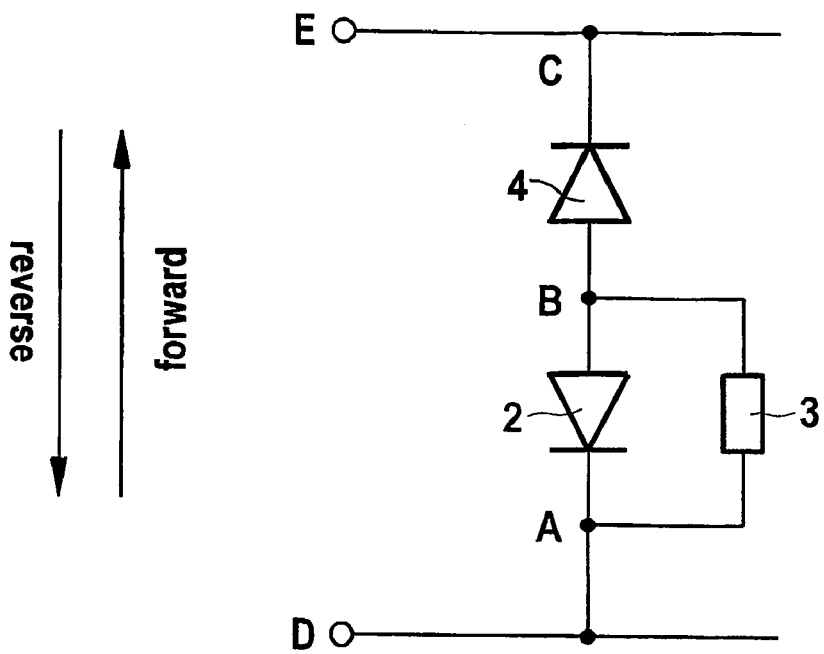
Fig. 1 state of art
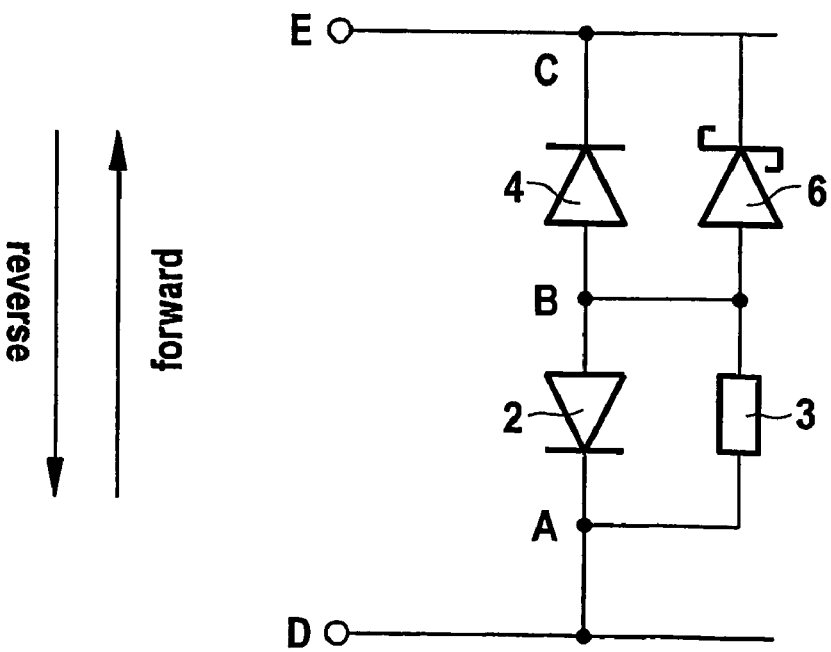
Fig. 2

PUNCH-THROUGH DIODE AND METHOD OF PROCESSING THE SAME

The invention relates to a punch-through (PT) diode which is an element that is mainly used for over voltage protection. A punch-through diode is a back-to-back (anti-serial) connection of two p-n-diodes where the space charge regions of the two junctions can merge under reverse bias condition (punch), such that current flow is enabled at voltages beyond the breakdown voltage (punch-through-voltage).

The invention especially relates to the monolithic integration of a Schottky-diode parallel to the forward-direction of a punch-through diode.

Punch-through diodes that are used in electronical circuits for the overvoltage protection have advantages compared to Zener-diodes at low reverse voltages.

A punch-through diode realized by only two back-to-back diodes does not show the normal forward behavior of a conventional p-n-diode with a voltage drop in the range of 0.7 V. Instead it has a high forward voltage drop, namely the break down voltage of the corresponding diode in the range of above 10 V.

The electronic apparatus protection against overvoltage damage is the higher, the lower the breakdown voltage of the corresponding diode is when the punch-through diode is forward biased.

Therefore, punch-through diodes are known which achieve an improved overvoltage protection by shortening that diode that blocks when reverse biased.

FIG. 1 schematically shows an equivalent circuitry 1 of a punch-through diode according to the state of art. Two p-n-diodes are connected back-to-back (anti-serial) and share a common combination point B. A first diode 2 has two differently doped areas and is arranged between the first combination point B and a second combination point A with the anode aligned towards the combination point B. The first diode 2 is shortened by for example a resistor 3 which is arranged between the first combination point B and the second combination point A. A second diode 4 also has two differently doped areas and is arranged between the first combination point B and a third combination point C with the anode aligned towards combination point B. This means both diodes 2, 4 are arranged in such a way that two similarly doped areas of the two diodes 2, 4 are aligned towards each other. The punch-through diode's equivalent circuitry 1 has two connection points D, E. The properties of the two p-n-diodes 2, 4 determine the behavior of the whole circuitry 1 depending on whether a forward or a reverse voltage is applied to the connection points D, E. Under reverse voltage, i. e. under voltage ED, the second diode 4 is reverse biased. The properties of the two differentially doped areas of the second diode 4 determine the punch-through voltage. The space charge regions of the two junctions can merge under reverse bias condition, such that current flow is enabled at voltages beyond the breakdown voltage (punch-through-voltage). Whereas, under forward voltage, i. e. voltage DE, the PT-diode shows the normal forward behavior of a conventional p-n-diode with a voltage drop in the range of 0.7 V as the first diode 2 is shortened by resistor 3.

It is standard to realize electronic circuits as monolithically integrated circuits which have small dimensions.

Public disclosure 58-161378 of Japan relates to a voltage diode whose punch-through voltage is set in a wide range from lower voltages to higher voltages. According to the disclosed method a semiconductor substrate, an epitaxial layer of reverse conductive type formed on the main surface thereof, and a metallic electrode layer which forms a Schottky junction between layers are equipped. That method results in a semiconductor substrate and an epitaxial layer that form a PN junction and a metal electrode layer that forms a Schottky junction that has rectification characteristics that are opposite to those of the above mentioned PN junction. By this procedure a fixed voltage diode of the punch-through type is offered wherein also a low punch-through voltage can be established and wherein fluctuations of the established voltage have been improved. That disclosure does not neither give a hint on the diode's speed reaction nor on a value for "low voltage".

Therefore, one object of the invention is to provide a punch-through diode with an improved protection against overvoltage when used in an electronic circuit that is realized as a monolithically integrated one.

Another object of the invention is to provide a method for manufacturing such a punch-through diode.

As regards the punch-through diode, the object is achieved by a punch-through diode as defined in claim 1 and in claim 2. It's construction reduces the voltage drop under forward voltage. Preferred embodiments are subject-matter of the sub-claims 3 to 8.

According to the invention the punch-through diode gets a Schottky-like behavior either in the npn-structure defined in claim 1 or in the pnp-structure defined in claim 2. This means: when the PT-diode is forward biased also the Schottky-diode become conductive. As the Schottky-diode has a lower threshold for the voltage drop as a p-n-diode the inventive punch-through diode as a whole reacts faster than those of the state of art. Further advantages of the Schottky-diode influence the punch-through diode in a positive manner, i.e. it switches fast and endures high loads of current.

The inventive punch-through diode realized as a monolithic circuit is based on a silicon dice or chip. In a preferred embodiment it is a monolithic integrated circuit built on a wafer. It is a known process to perform the steps of oxidation, implantation and annealing with regard to a silicon dice or chip. First an epilayer is generated. Then during the step of implantation the substrate is doped in the desired way by implanting appropriate ions after oxidation and a mask step. During the step of annealing the implanted atoms are diffused and create regions which form the doped wells.

According to the invention a first p-doped or n-doped well of the silicon dice or chip corresponds to the semiconductor part of the Schottky-diode. This means that for adding the Schottky-diode's semiconductor part an additional step during the processing is not necessary.

According to one embodiment the Schottky-metal area overlaps the edges of the ambient oxide layer. Thus the opening in the oxide layer is securely covered.

The metal part of the Schottky-diode is realized by a Schottky-metal area arranged on the first p-doped well or the first n-doped well of the silicon dice or chip with the Schottky-metal area and the first p-doped well or the first n-doped well respectively being in contact. In a further preferred embodiment the Schottky-diode metal area is made of a material from the group comprising aluminium (Al), titanium (Ti), iron (Fe), chrome (Cr), nickel (Ni), molybdenum (Mo), palladium (Pd).

A layer of aluminum may be added to the surface of the $n^+$-substrate or $p^+$-substrate respectively to enable the contact of a first terminal point of the punch-through diode. A metalized layer above the Schottky-metal area and the polysilicon area enables the contact to a second terminal point. Thus a punch-through diode is formed.

According to an another embodiment the inventive punch-through diode is realized as a thick film circuit. The advantage of this embodiment is that it can be treated as a surface-mounted-device (SMD) which has small dimensions and weight can stand loadings.

This solution makes it possible to protect an electronic appliance comprising the inventive punch-through from overvoltage damage, because the inventive punch-through diode reacts fast and at low voltages near zero V. The state of art PT-diode has a rather high forward characteristic which is defined by a single p-n-transition. This single p-n-transition is by-passed by the metal-semiconductor-transition and that results in a low forward voltage drop.

The inventive punch-through diode may be used as overvoltage protection in an integrated circuit as it reacts fast and thus avoids the increase of a damaging current.

The preferred embodiment is realized as a monolithically integrated circuit which is processed with only a few additional steps for adding the Schottky-diode.

As regards the methods and the there mentioned steps of forming the wells are for example realized by carrying out known processing measures such as implantation, diffusion, annealing.

The invention will now be described in detail with reference to the accompanying drawings. The detailed description will illustrate and describe what is considered as a preferred embodiment of the invention. It should, of course, be understood that various modifications and changes in form or detail could readily be made without departing from the spirit of the invention. It is therefore intended that the invention may not be limited to the exact form and detail shown and described herein, nor to anything less than the whole of the invention disclosed herein and as claimed herein after. Further the features described in the description, the drawing, and the claims disclosing the invention may be essential for the invention, considered alone or in combination.

Figure 3B:
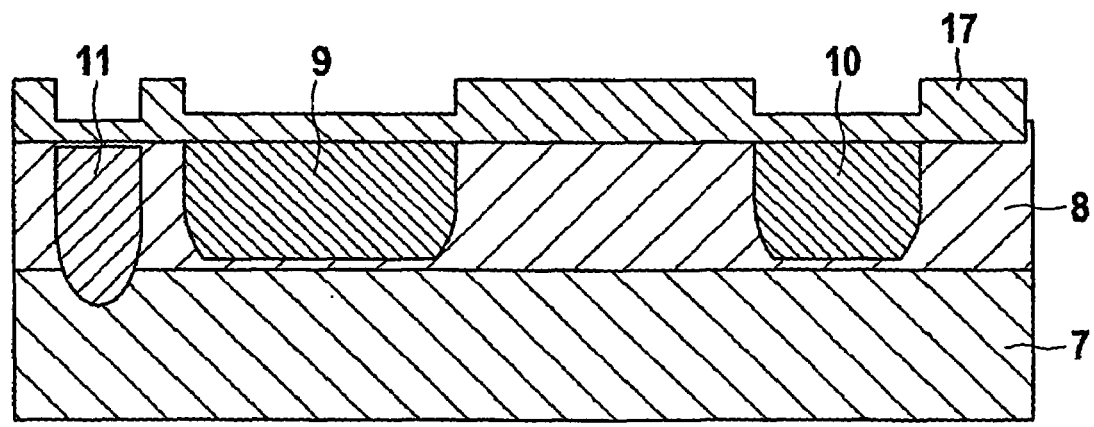
Figure 3C:
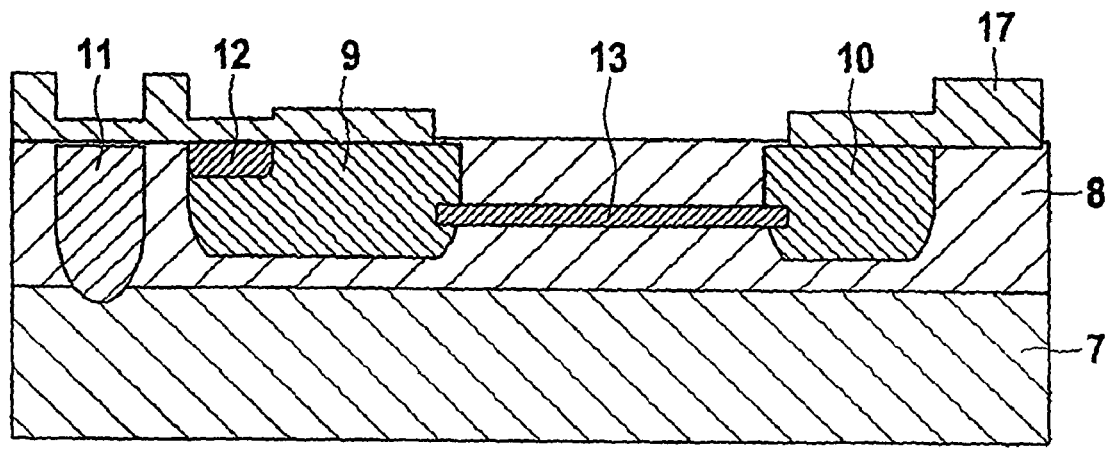
Figure 3D:
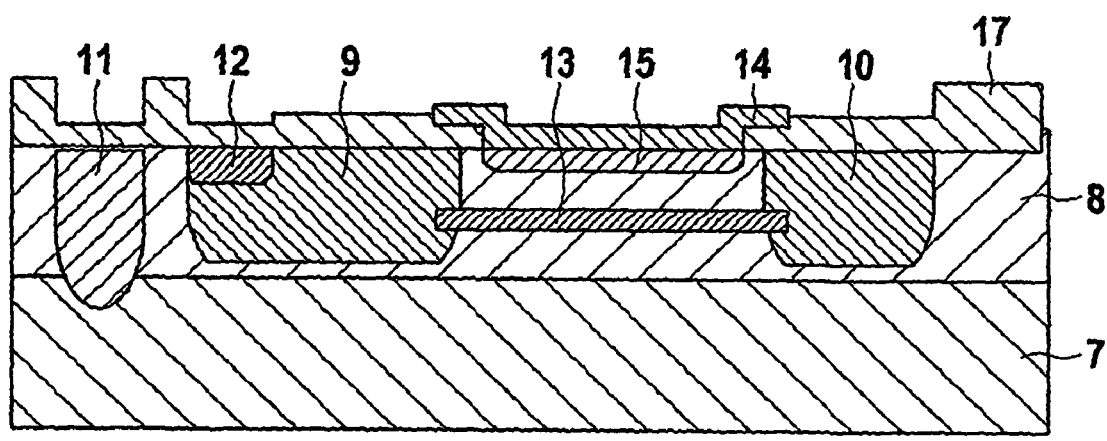
Figure 3E:
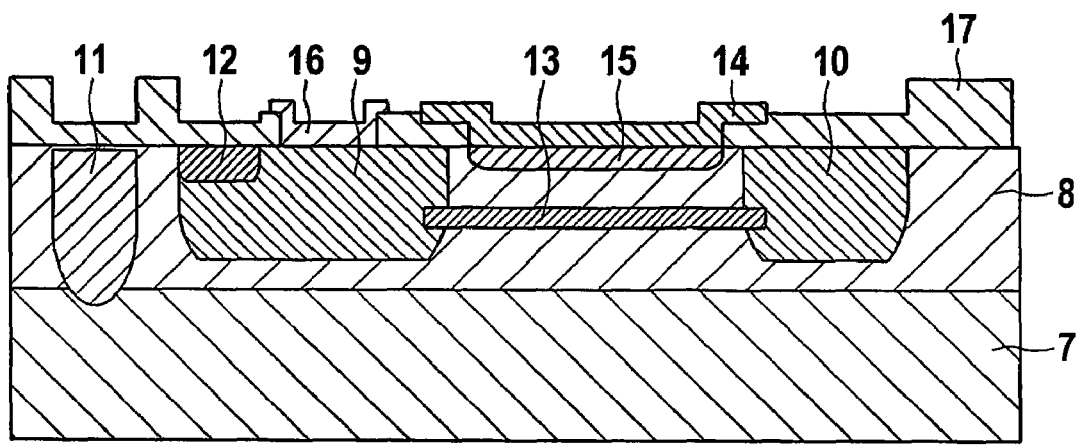
Figure 3F:
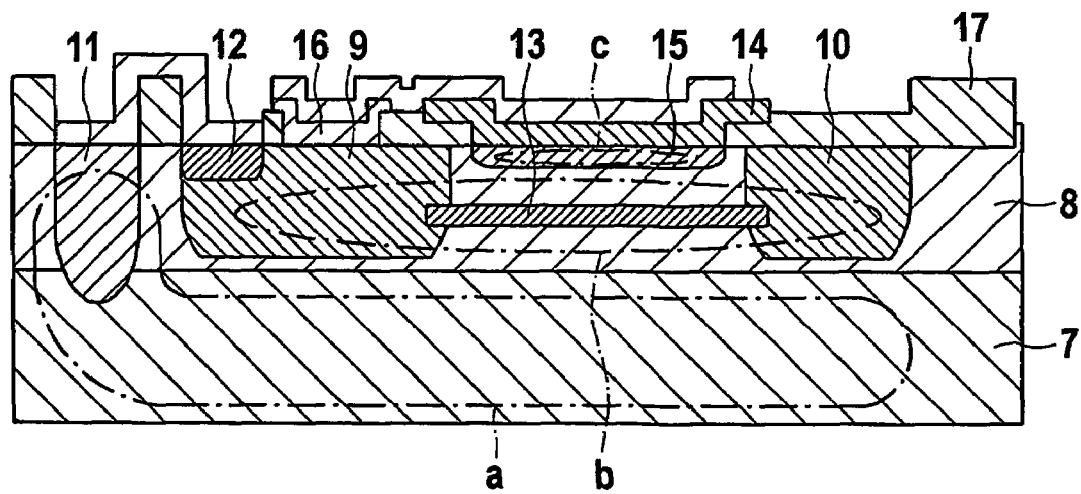

FIG. 2 schematically shows an equivalent circuitry of a punch-through diode according to the invention;

FIG. 3 schematically shows in its partial Figures a) to f) the process flow to build up a punch-through diode with an npn-structure according to the invention.

FIG. 2 schematically shows an equivalent circuitry 5 of a PT-diode according to the invention. The first and the second diodes 2, 4 as well as the resistor 3 are similar to those of the arrangement of FIG. 1. In the monolithically integrated circuit a Schottky-diode 6 is arranged parallel to the second diode 4 between the combination points B and C. The Schottky-diode 6 is aligned in the same way as the second diode 4. As the Schottky-diode 6 has a rather low threshold voltage, i. e. a threshold voltage lower than the second diode 4, the Schottky-diode 6 together with the short between combination point A and combination point B determines the forward characteristics of the inventive PT-diode.

FIG. 3 schematically shows in its partial Figures an example of a process flow to build up an inventive PT-diode with an npn-structure.

In step (3a) an $n^+$-doped substrate 7 such as a silicon dice is provided and covered with an n-doped epilayer 8. The epilayer 8 is generated by the deposition of silicon, which is subjected to build up an oxide layer 17 on said epilayer 7. A first mask step and a following window etching are carried out. Then a first p-well 9 as well as a second p-well 10 are implanted into the n-epilayer 8 below the holes of the oxide layer 17. The $n^+$-doped substrate 7 will be part of the region "a" of the later punch-through diode, whereas the two p-doped wells 9, 10 will be treated in such a way to form the later region "b".

In step (3b) annealing and oxidation are carried out. A second mask is applied and a further window is etched to enable the implantation of an n-well 11 which penetrates through the n-doped epilayer 8 and penetrates into the $n^+$-substrate 7. Diffusion and oxidation are carried out. This n-well 11 forms a plug contact to region "a".

In step (3c) a third mask step and a further window etching are carried out. A $p^+$-doped well 12 is implanted into the first p-doped well 9 for the ohmic contact to region "b". Diffusion and oxidation are carried out. In a fourth mask step a window is etched into the oxidation layer 17 in the region between the first and the second p-doped well 9, 10 and as well as above a part of their opposite margin edges. A deep p-implantation and a following annealing is carried out to form a $p^+$-doped well 13 which connects both the first and the second p-doped wells 9, 10 which are part of region "b".

In step (3d) a further oxide layer is deposited, a fifth mask step and a further window etching are carried out. A polysilicon area 14 is deposited onto the n-epilayer 8 between the first and the second n-doped wells 9, 10 and overlaps the edges of the oxide layer. The polysilicon is n-doped by implanting an appropriate material. A subsequent diffusion step builds a n-doped region 15 in the epilayer 8 just below the polysilicon area 14. This procedure results in a layer that is diffused as flat as necessary. The remaining oxide layer 17 is an isolator. A sixth mask step and a following polysilicon etching are carried out. Afterwards n-diffusion from the polysilicon to the n-epilayer 8 is carried out.

In step (3e) after a seventh mask step and a following window etching the Schottky-metal 16 is deposited onto a part of the first p-doped well 9 and overlaps the oxide layer. An eighth mask step and a following etching of the Schottky-metal 16 is carried out in order to form the Schottky-metal in an appropriate way. The metal-semiconductor-contact of the Schottky-diode is realized by the said Schottky-metal 16 and the p-doped well 9 of the silicon dice.

In step (3f) a ninth mask step and a following window etching are carried out—in order to prepare the device for the deposition of a contact metal. A tenth mask step and a following metal etching are carried out. Just to complete the picture it is mentioned that afterwards glass is deposited as well as an eleventh mask step and a following window etching are carried out.

The two differently doped areas of the first and of the second diodes 2, 4 as well as the metal-semiconductor-transition are illustrated in the device shown in step (3f) of FIG. 3. The n-doped area of the first diode of FIG. 2 is marked as region "a", the n-doped area of the second diode of FIG. 2 is marked as region "c", and the p-doped area of both of them is marked as region "b".

The regions forming the connection points D and E are not shown. They might be processed by adding as shown an Aluminium layer on top and a metal layer on bottom of the punch-through diode.

The PT-diode may also be built inverse, that is with a pnp-structure.

The process flow schematically shown in FIG. 3 illustrates that a punch-through diode which improves the protection against overvoltage can be manufactured as monolithic integrated circuit by adding a Schottky-metal in an appropriate way onto the same crystal or wafer.

The invention can be summarized by a monolithically integrated punch-through diode with a Schottky-like behavior. This is achieved as a Schottky-metal area (16) is deposited onto at least part of the first p-doped well's (9) surface. The Schottky-metal area (16) and the p-doped well (9) form the metal-semiconductor-transition of a Schottky-diode. The overvoltage protection of the inventive PT-diode is improved as the forward characteristic has a voltage drop that is less than 0.5 V.

The invention claimed is:

1. A punch-through diode realized as a monolithically integrated circuit based an a silicon dice or chip, comprising an n+-doped substrate covered with an n-doped epilayer; a first p-well and a second p-well implanted into the n-doped epilayer with a distance between the two wells; an n-well penetrating through the n-doped epilayer and into the n+-substrate; a first p+-doped well which connects both the first and the second p-doped wells; a polysilicon area on the n-epilayer between the first and the second p-doped wells overlapping the edges of an oxide layer; characterized in that a Schottky-metal area is deposited onto at least part of the first p-doped well's surface thus forming a metal—semiconductor—transition and that a second p+-doped well is implanted into the first p-doped well.

2. Use a punch-through diode according to any of the claim 1 for over voltage protection in an integrated circuit.

3. A punch-through diode realized as a monolithically integrated circuit based an a silicon dice or chip, comprising a p+-doped substrate covered with a p-doped epilayer; a first n-well and a second n-well implanted into the p-doped epilayer with a distance between the two wells; a p-well penetrating through the p-doped epilayer and into the p+-substrate; a first n+-doped well which connects both the first and the second n-doped wells; a polysilicon area on the p-epilayer between the first and the second n-doped wells overlapping the edges of an oxide layer; characterized in that a Schottky-metal area is deposited onto at least part of the first n-doped well's surface thus forming a metal—semiconductor—transition and that a second n+-doped well is implanted into the first n-doped well.

4. A punch-through diode according to claim 3 characterized in that the monolithic integrated circuit is built on a wafer.

5. A punch-through diode according to claim 3 characterized in that the Schottky-metal overlaps the edges of the ambient oxide layer.

6. A punch-through diode as claimed in claim 3 characterized in that the Schottky-metal area is made of a material from the group comprising aluminum (Al), titanium (Ti), iron (Fe), chrome (Cr), nickel (Ni), molybdenum (Mo), palladium (Pd).

7. A punch-through diode according claim 3 characterized in that the punch-through diode comprises a layer of aluminum on the surface of the $n^+$-substrate or $p^+$-substrate to enable the contact of a first terminal point of the punch-through diode.

8. A punch-through diode according to claim 3 claims characterized in that the punch-through diode comprises a metalized layer above the Schottky-metal area and the polysilicon area that enables the contact to a second terminal point.

9. A punch-through diode as claimed in claim 3 characterized in that it is realized as a thick film circuit.

10. An electronic appliance, comprising a punch-through diode according to claim 3.

* * * * *